United States Patent [19]

Sugioka

[11] Patent Number: 4,525,382
[45] Date of Patent: Jun. 25, 1985

[54] PHOTOCHEMICAL VAPOR DEPOSITION APPARATUS

[75] Inventor: Shinji Sugioka, Kawasaki, Japan

[73] Assignee: Ushio Denki Kabushiki Kaisha, Tokyo, Japan

[21] Appl. No.: 566,792

[22] Filed: Dec. 29, 1983

[30] Foreign Application Priority Data

Jan. 18, 1983 [JP] Japan .................................. 58-5266

[51] Int. Cl.³ .......................... C23C 13/08; B05D 3/06
[52] U.S. Cl. ..................................... 427/54.1; 427/38; 118/719; 118/723; 118/50.1
[58] Field of Search .................... 427/38, 54.1, 39, 40, 427/41; 118/723, 50.1, 719, 620

[56] References Cited

U.S. PATENT DOCUMENTS 4,158,589  6/1979  Keller et al. ..................... 156/345 X
4,454,835  6/1984  Walsh et al. ..................... 118/719 X Primary Examiner—John D. Smith
Assistant Examiner—Bernard F. Plantz
Attorney, Agent, or Firm—Ziems, Walter & Shannon

[57] ABSTRACT

In a photochemical vapor deposition apparatus comprising a reaction space, which forms a passage for a photoreactive gas and in which a substrate is to be placed, and a discharge space, in which electric plasma discharge is generated for radiating ultraviolet rays which cause photochemical reaction of the photoreactive gas, both the spaces being surrounded by the same vessel, discharging electrodes arranged opposite one another with said discharge space therebetween, and a grid comprising a wire-netting of metal interposed between the discharge space and the reaction space, to which grid is applied a voltage of positive potential.

This photochemical vapor deposition apparatus can achieve photochemical vapor deposition with high efficiency, because the diffusion of plasma into the reaction space is interrupted by the grid so that the substrate is permitted to be placed at a position closer to an ultraviolet ray source and ultraviolet rays of larger intensity are applied to the substrate. As a result, photochemical vapor deposition can be achieved with high efficiency.

8 Claims, 2 Drawing Figures

PHOTOCHEMICAL VAPOR DEPOSITION APPARATUS

BACKGROUND OF THE INVENTION

1. Field of the Invention

This invention relates to a photochemical vapor deposition apparatus.

2. Description of the Prior Art

Recently, there, have been studied methods for forming a vapor-deposited film of amorphous silicon for use in the photosensitive drum of a duplicating machine or a solar cell. On the other hand, a vapor depositing method is further utilized in the formation of diverse insulating films or protective films, and a variety of vapor depositing methods have been proposed in answer to various uses. Among these methods, a photochemical vapor depositing method utilizing a photochemical reaction is being particularly watched now because it has such advantages as the film-forming rate being remarkably high and a uniform film being formable on a portion of large area of a substrate, too.

A conventional chemical vapor depositing method utilizing a photochemical reaction comprises placing a substrate in an air-tight vessel made of material through which ultraviolet rays can be fully transmitted, feeding a photoreactive gas to flow through the vessel and applying ultraviolet rays radiated from an ultraviolet discharge lamp outside of the vessel through the wall thereof onto the substrate so that a photochemical reaction is caused to decompose the photoreactive gas and the resulting reaction product is vapor-deposited onto the substrate. In spite of having the above-mentioned remarkable advantages, this conventional photochemical deposition method, that may be called an "outer discharge type", has been found to have the defect that the reaction product is also vapor-deposited on the inner wall of the vessel, thereby seriously impeding the transmission of ultraviolet rays.

Thus, a photochemical vapor deposition apparatus, that may be called an "inner discharge type", has been studied and developed. In the apparatus of this type, a reaction space and a discharge space are surrounded by the same in an airtight manner. The reaction space forms a passage for a photoreactive gas and in this reaction space a substrate is placed. In the discharge space, an electric plasma discharge is generated and ultraviolet rays radiated from the plasma are directed onto the substrate to cause a photochemical reaction of decomposition of the photoreactive gas. Between the plasma and the substrate, there is no partition member that impedes passing of the ultraviolet rays.

In the above-mentioned apparatus, a part of the plasma of electric discharge between electrodes diffuses or expands and the vapor-deposited film which is being formed on the substrate is damaged by the plasma. In order to prevent such damaging of the film, it is required that the substrate be placed at a position more remote than the mean free path of ions or electrons produced in the plasma. To carry out vapor deposition with high efficiency, however, it is necessary to keep the substrate near to the ultraviolet ray source, i.e. the plasma, as much as possible, so that ultraviolet rays of larger intensity reach the substrate.

SUMMARY OF THE INVENTION

With the foregoing in view, an object of this invention is to provide a photochemical vapor deposition apparatus of an inner discharge type in which diffusing or expansion of plasma that may cause damage to the film being formed is prevented by a simple construction, thereby permitting a substrate to be placed at a position close enough to an ultraviolet ray source of plasma that vapor-deposition can be carried out with high efficiency.

In accordance with this invention, there is provided a photochemical vapor deposition apparatus wherein a reaction space, which forms a passage for a photoreactive gas and in which a substrate is to be placed, and a discharge space, in which electric plasma discharge is generated for radiating ultraviolet rays to cause a photochemical reaction of the photoreactive gas, are surrounded in an airtight manner by the same vessel, discharging electrodes are arranged opposite one another with the discharge space therebetween, and a grid consisting of a wire-netting of metal is interposed between the discharge space and the reaction space.

The inner discharge type of photochemical reaction vapor deposition apparatus according to this invention can achieve the photochemical vapor deposition with high efficiency, because the grid is interposed between the discharge space and the substrate, thereby preventing the plasma from diffusion or expansion over the grid, so that the substrate can be placed at a position closer to the plasma so as to receive a greater intensity of ultraviolet rays radiated from the plasma.

The principle and construction of this invention will be clearly understood from the following detailed description and appended claims, taken in conjunction with the accompanying drawing.

DETAILED DESCRIPTION OF THE INVENTION AND PREFERRED EMBODIMENTS

Embodiments of this invention will be concretely described with reference to the accompanying drawing.

Figure 1:
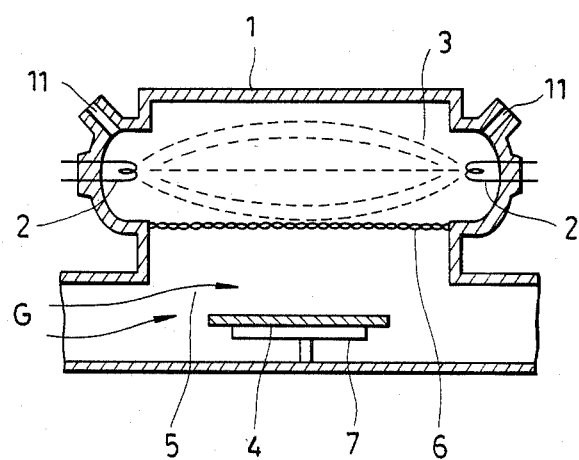
FIG. 1 is a cross-sectional view showing an embodiment of the inner discharge type of photochemical vapor deposition apparatus according to this invention.

In FIG. 1, a pair of electrodes 2, 2 are arranged opposite to each other in the upper part of an air-tight vessel 1, and the space between the electrodes 2, 2 constitutes a discharge space 3. Gas supply ports 11, 11 are provided in the vicinities of each of the electrodes 2, 2, from which ports a gas for electric discharge is fed to the inside of the vessel 1, which is kept at reduced pressure, to generate electric plasma discharge between the electrodes 2, 2. The lower part of the vessell just under the discharge space 3 is a passage for a photochemically reactive gas G and constitutes a reaction space 5 wherein is placed a substrate 4 onto which deposited-film is to be formed. A partition such as a transparent quartz glass plate or the like is not provided between the discharge space 3 and the reaction space 5, but a grid 6 that is a planar wire-netting made of tungsten is interposed therebetween, to which is applied a voltage of positive potential. Numeral 7 denotes supporting table on which the substrate 4 is supported.

An example of the vapor deposition process using the apparatus of the structure mentioned above will be described hereinafter. A photoreactive gas G, which was a mixed gas consisting of argon of 5 mmHg as a carrier gas, mercury vapor of $3 \times 10^{-3}$ mmHg as a photosensitizer and silane gas of 1 mmHg as a gas for vapor deposition, was fed to flow through the reaction space 5, and a mixed gas consisting of argon of 8 mmHg and mercury of $2 \times 10^{-3}$ mmHg was supplied, as a gas for electric discharge, to the discharge space 3 through the gas supply ports 11, 11. A substrate 4 of an alumina plate placed on the supporting table 7 was heated at about 150° C. When electric plasma discharge was generated at a voltage of 60 V and an amperage of 5 A in the discharge space 3, ultraviolet rays radiated from plasma of argon and mercury were directed onto the substrate 4 through the grid 6 to which positive potential was applied. As a result, the silane gas was decomposed on the surface of the substrate 4 by the ultraviolet rays so that amorphous silicon was vapor-deposited on the substrate 4.

Figure 2:
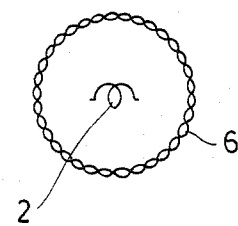
FIG. 2 is a cross-sectional view of another embodiment of the grid which may be used in the photochemical vapor deposition apparatus according to this invention.

In this embodiment, it is important that the grid 6 is interposed between the discharge space 3 and the reaction space 5 and applied with a voltage of positive potential. If the plasma has diffused in the direction of the substrate 4, it does not diffuse past the grid 6, because electrons of the plasma are absorbed by the grid 6. Accordingly, the substrate 4 may be placed at a position closer to the grid 6 without damaging the vapor-deposited film formed thereon by the plasma. Since the substrate 4 is permitted to be placed near to the ultraviolet ray source, furthermore, ultraviolet rays of larger density can be applied to the substrate and the photochemical vapor deposition can be achieved with high efficiency. Moreover, the plasma can be interrupted so as not to diffuse into the reaction space 5 by regulating the potential of the grid 6, even if the mesh of the grid 6, that is shaped in the form of a wire-netting, is rough. Since the grid 6 can scarcely absorb ultraviolet rays, the lowering of the efficiency of application of ultraviolet rays due to the insertion of said grid 6 between the discharge space 3 and the reaction space 5 is slight. In case the area of the substrate 4 is large and the quantity of ultraviolet rays applied to its circumferential portion is small as compared with that on its central portion, in other words, if there are some problems in the uniformity of the radiation of ultraviolet rays, it is possible to apply ultraviolet rays uniformly onto the whole surface of the substrate 4 by making the mesh of the grid 6 at its central portion dense so that the quantity of ultraviolet rays passing through the grid 6 is regulated. The grid 6 is not limited to a planar one, and it may be feasible to use another grid shaped in the form of a cylinder as shown in FIG. 2, in which the electrodes 2, 2 are positioned at both its ends.

Having now fully described the invention, it will be understood for those skilled in the art that various changes and modifications can be made thereto without departing from the spirit or scope of the invention as set forth herein.

What is claimed is:

1. A photochemical vapor deposition apparatus wherein a reaction space forming a passage for a photoreactive gas, in which reaction space a substrate is to be placed, and a discharge space, in which electric plasma discharge is generated for radiating ultraviolet rays which cause photochemical reaction of said photoreactive gas are surrounded by the same airtight vessel, discharging electrodes are arranged opposite one another with said discharge space therebetween, and a grid comprising a wire-netting of metal is interposed between the discharge space and the reaction space, wherein the mesh of said grid in its central portion is dense as compared with that in its circumferential portion so that the quantity of ultraviolet rays applied to the substrate is made to be uniform.

2. A photochemical vapor deposition apparatus comprising:
   means, including an air tight vessel, for defining a reaction space into which a substrate is to be placed and a discharge space in which electric plasma discharge is generated for radiating ultraviolet rays, said reaction space defining a passage for a photoreactive gas, and said ultraviolet rays causing photochemical reaction of said photoreactive gas;
   discharging electrodes arranged on opposite sides of said discharge space; and
   a grid comprising a wire-netting of metal interposed between said discharge space and said reaction space.

3. A photochemical vapor deposition apparatus as set forth in claim 2, wherein the mesh of said grid in its central portion is dense as compared with that in its circumferential portion so that the quantity of ultraviolet rays applied to the substrate is made to be uniform.

4. A photochemical vapor deposition apparatus as set forth in claim 2 wherein a voltage of positive potential is applied to said grid.

5. A photochemical vapor deposition method for depositing material on a substrate comprising:
   providing an air-tight vessel having a reaction space defining a passage for a photoreactive gas, and a discharge space having discharging electrodes on opposite sides;
   placing the substrate in the reaction space;
   interposing a grid comprising a wire-netting of metal between said reaction space and said discharge space;
   feeding photoreactive gas through the reaction space; and
   generating electric plasma discharge between said discharging electrodes for radiating ultraviolet rays and transmitting the ultraviolet rays onto said substrate through said grid and said photoreactive gas for causing photochemical reaction of said photoreactive gas to deposit a product material of the photochemical reaction on said substrate.

6. A photochemical vapor deposition method according to claim 5, further comprising applying a voltage of positive potential to said grid.

7. A photochemical vapor deposition method for depositing material on a substrate comprising:
   providing an air-tight vessel having a discharge space and a reaction space;
   feeding a photoreactive gas to the reaction space;
   generating electric plasma discharge in the discharge space for transmitting ultraviolet rays through said photoreactive gas for causing photochemical reaction of said photoreactive gas to deposit a product material of the photochemical reaction on said substrate; and
   preventing the electric plasma discharge from reaching the substrate by interposing a grid of metal between said discharge space and said reaction space.

8. A photochemical vapor deposition method according to claim 7, further comprising the step of applying a voltage of positive potential to said grid.

* * * * *